US011574100B2

(12) United States Patent
Kale

(10) Patent No.: US 11,574,100 B2
(45) Date of Patent: Feb. 7, 2023

(54) INTEGRATED SENSOR DEVICE WITH DEEP LEARNING ACCELERATOR AND RANDOM ACCESS MEMORY

(71) Applicant: Micron Technology, Inc., Boise, ID (US)

(72) Inventor: Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 234 days.

(21) Appl. No.: 16/906,213

(22) Filed: Jun. 19, 2020

(65) Prior Publication Data

US 2021/0397771 A1    Dec. 23, 2021

(51) Int. Cl.
| | | |
|---|---|---|
| *G06F 15/16* | (2006.01) | |
| *G06F 30/331* | (2020.01) | |
| *G06F 13/16* | (2006.01) | |
| *G06F 13/42* | (2006.01) | |
| *G06F 9/30* | (2018.01) | |
| *G06F 3/06* | (2006.01) | |
| *G06N 3/08* | (2006.01) | |

(52) U.S. Cl.
CPC .......... *G06F 30/331* (2020.01); *G06F 3/0607* (2013.01); *G06F 3/0658* (2013.01); *G06F 9/30036* (2013.01); *G06F 13/1668* (2013.01); *G06F 13/4282* (2013.01); *G06N 3/08* (2013.01); *G06F 3/0679* (2013.01)

(58) Field of Classification Search
CPC .... G06F 30/331; G06F 3/0607; G06F 3/0658; G06F 9/30036; G06F 13/1668; G06F 13/4282; G06F 3/0679; G06N 3/08
See application file for complete search history.

(56) References Cited

U.S. PATENT DOCUMENTS

| | | | | |
|---|---|---|---|---|
| 10,540,318 | B2* | 1/2020 | Koker | G06N 3/0445 |
| 10,803,548 | B2* | 10/2020 | Matam | G06F 13/4027 |
| 11,010,516 | B2* | 5/2021 | Sikka | G06N 7/005 |
| 11,227,029 | B2* | 1/2022 | Das Sarma | G06N 3/063 |

(Continued)

FOREIGN PATENT DOCUMENTS

KR    20190047648    5/2019

OTHER PUBLICATIONS

International Search Report and Written Opinion, PCT/US2021/037552, dated Sep. 24, 2021.

*Primary Examiner* — Cheng Yuan Tseng
(74) *Attorney, Agent, or Firm* — Greenberg Traurig

(57) ABSTRACT

Systems, devices, and methods related to a Deep Learning Accelerator and memory are described. For example, an integrated sensor device may be configured to execute instructions with matrix operands and configured with: a sensor to generate measurements of stimuli; random access memory to store instructions executable by the Deep Learning Accelerator and store matrices of an Artificial Neural Network; a host interface connectable to a host system; and a controller to store the measurements generated by the sensor into the random access memory as an input to the Artificial Neural Network. After the Deep Learning Accelerator generates in the random access memory an output of the Artificial Neural Network by executing the instructions to process the input, the controller may communicate the output to a host system through the host interface.

17 Claims, 9 Drawing Sheets

(56) References Cited

U.S. PATENT DOCUMENTS

| | | |
|---|---|---|
| 2011/0167024 A1 | 7/2011 | Maldonado Diaz |
| 2017/0083827 A1 | 3/2017 | Robatmili et al. |
| 2017/0316312 A1 | 11/2017 | Goyal et al. |
| 2018/0189229 A1* | 7/2018 | Desoli .................. G06N 3/0454 |
| 2019/0033848 A1* | 1/2019 | Cella ....................... H04W 4/70 |
| 2019/0205737 A1* | 7/2019 | Bleiweiss .............. G06N 20/00 |
| 2019/0258251 A1* | 8/2019 | Ditty ..................... G06V 20/58 |
| 2019/0325303 A1 | 10/2019 | Daga et al. |
| 2021/0006755 A1* | 1/2021 | Kim ................. H04N 5/232411 |
| 2021/0286923 A1* | 9/2021 | Kristensen ............. G06F 30/27 |
| 2021/0319305 A1* | 10/2021 | Kale ...................... G06N 3/063 |
| 2021/0320967 A1* | 10/2021 | Kale ...................... G06N 3/063 |
| 2022/0027709 A1* | 1/2022 | Honkala ................ G06V 10/95 |
| 2022/0114807 A1* | 4/2022 | Iancu ................... G06N 3/0454 |

\* cited by examiner

INTEGRATED SENSOR DEVICE WITH DEEP LEARNING ACCELERATOR AND RANDOM ACCESS MEMORY

FIELD OF THE TECHNOLOGY

At least some embodiments disclosed herein relate to sensor devices in general and more particularly, but not limited to, sensor devices with integrated accelerators for Artificial Neural Networks (ANNs), such as ANNs configured through machine learning and/or deep learning.

BACKGROUND

An Artificial Neural Network (ANN) uses a network of neurons to process inputs to the network and to generate outputs from the network.

For example, each neuron in the network receives a set of inputs. Some of the inputs to a neuron may be the outputs of certain neurons in the network; and some of the inputs to a neuron may be the inputs provided to the neural network. The input/output relations among the neurons in the network represent the neuron connectivity in the network.

For example, each neuron can have a bias, an activation function, and a set of synaptic weights for its inputs respectively. The activation function may be in the form of a step function, a linear function, a log-sigmoid function, etc. Different neurons in the network may have different activation functions.

For example, each neuron can generate a weighted sum of its inputs and its bias and then produce an output that is the function of the weighted sum, computed using the activation function of the neuron.

The relations between the input(s) and the output(s) of an ANN in general are defined by an ANN model that includes the data representing the connectivity of the neurons in the network, as well as the bias, activation function, and synaptic weights of each neuron. Based on a given ANN model, a computing device can be configured to compute the output(s) of the network from a given set of inputs to the network.

For example, the inputs to an ANN network may be generated based on camera inputs; and the outputs from the ANN network may be the identification of an item, such as an event or an object.

In general, an ANN may be trained using a supervised method where the parameters in the ANN are adjusted to minimize or reduce the error between known outputs associated with or resulted from respective inputs and computed outputs generated via applying the inputs to the ANN. Examples of supervised learning/training methods include reinforcement learning and learning with error correction.

Alternatively, or in combination, an ANN may be trained using an unsupervised method where the exact outputs resulted from a given set of inputs is not known before the completion of the training. The ANN can be trained to classify an item into a plurality of categories, or data points into clusters.

Multiple training algorithms can be employed for a sophisticated machine learning/training paradigm.

Deep learning uses multiple layers of machine learning to progressively extract features from input data. For example, lower layers can be configured to identify edges in an image; and higher layers can be configured to identify, based on the edges detected using the lower layers, items captured in the image, such as faces, objects, events, etc. Deep learning can be implemented via Artificial Neural Networks (ANNs), such as deep neural networks, deep belief networks, recurrent neural networks, and/or convolutional neural networks.

Deep learning has been applied to many application fields, such as computer vision, speech/audio recognition, natural language processing, machine translation, bioinformatics, drug design, medical image processing, games, etc.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
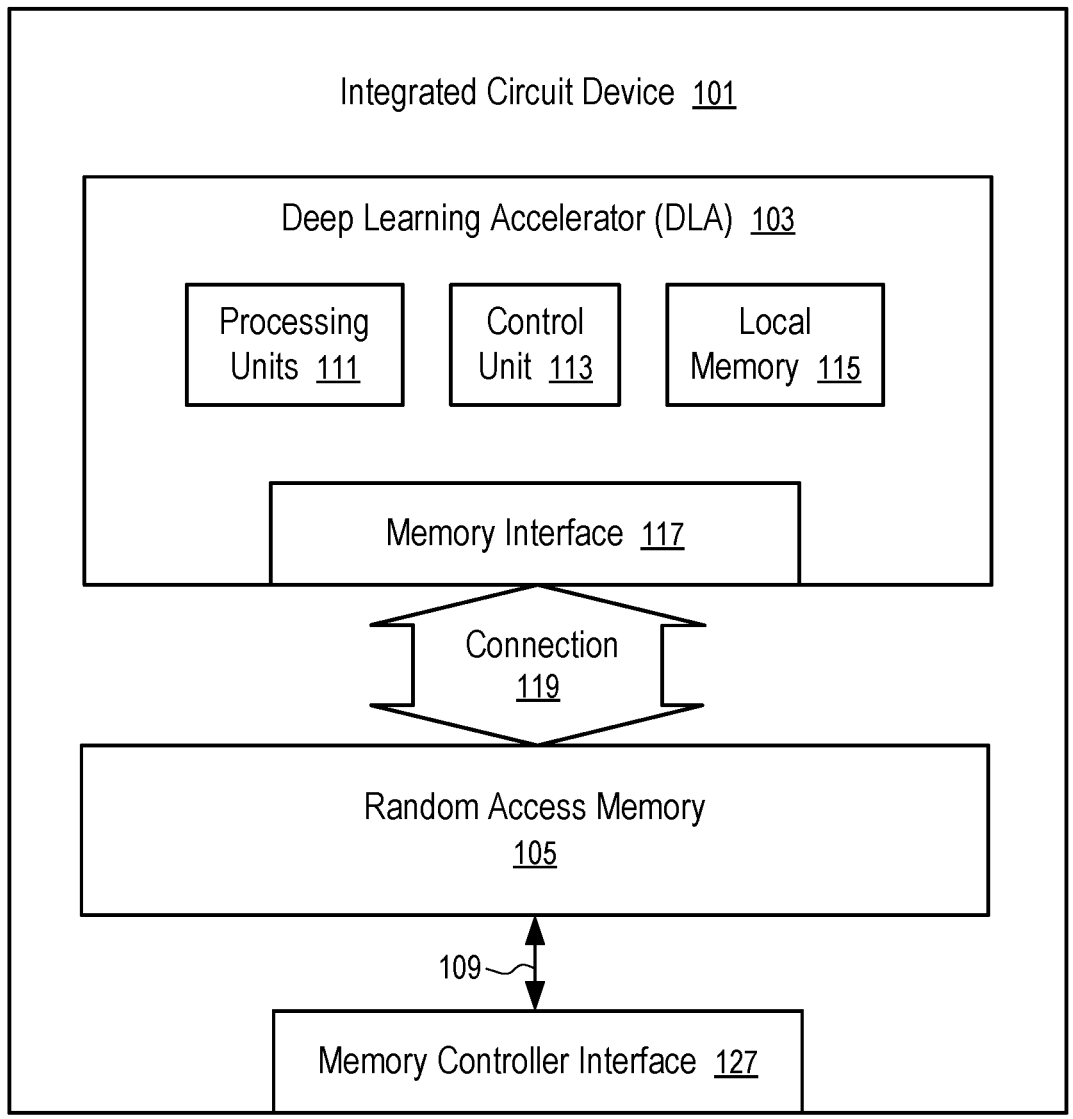
FIG. 1 shows an integrated circuit device having a Deep Learning Accelerator and random access memory configured according to one embodiment.

At least some embodiments disclosed herein provide a sensor device that has a general-purpose integrated circuit configured to perform computations of Artificial Neural Networks (ANNs) with reduced energy consumption and computation time. The integrated circuit includes a Deep Learning Accelerator (DLA) and random access memory. Sensor data generated in the sensor device is stored in the random access memory and processed by an Artificial Neural Network (ANN) implemented using the Deep Learning Accelerator (DLA). The outputs of the Artificial Neural Network (ANN) can be provided from the sensor device to a host system. Optionally, the host system may also request the inputs to the Artificial Neural Network (ANN) for further analysis.

The Deep Learning Accelerator (DLA) includes a set of general-purpose, programmable hardware computing logic that is specialized and/or optimized to perform parallel vector and/or matrix calculations, including but not limited to multiplication and accumulation of vectors and/or matrices.

Further, the Deep Learning Accelerator (DLA) can include one or more Arithmetic-Logic Units (ALUs) to perform arithmetic and bitwise operations on integer binary numbers.

The Deep Learning Accelerator (DLA) is programmable via a set of instructions to perform the computations of an Artificial Neural Network (ANN).

The granularity of the Deep Learning Accelerator (DLA) operating on vectors and matrices corresponds to the largest unit of vectors/matrices that can be operated upon during the execution of one instruction by the Deep Learning Accelerator (DLA). During the execution of the instruction for a predefined operation on vector/matrix operands, elements of vector/matrix operands can be operated upon by the Deep Learning Accelerator (DLA) in parallel to reduce execution time and/or energy consumption associated with memory/data access. The operations on vector/matrix operands of the granularity of the Deep Learning Accelerator (DLA) can be used as building blocks to implement computations on vectors/matrices of larger sizes.

The implementation of a typical/practical Artificial Neural Network (ANN) involves vector/matrix operands having sizes that are larger than the operation granularity of the Deep Learning Accelerator (DLA). To implement such an Artificial Neural Network (ANN) using the Deep Learning Accelerator (DLA), computations involving the vector/matrix operands of large sizes can be broken down to the computations of vector/matrix operands of the granularity of the Deep Learning Accelerator (DLA). The Deep Learning Accelerator (DLA) can be programmed via instructions to carry out the computations involving large vector/matrix operands. For example, atomic computation capabilities of the Deep Learning Accelerator (DLA) in manipulating vectors and matrices of the granularity of the Deep Learning Accelerator (DLA) in response to instructions can be programmed to implement computations in an Artificial Neural Network (ANN).

In some implementations, the Deep Learning Accelerator (DLA) lacks some of the logic operation capabilities of a typical Central Processing Unit (CPU). However, the Deep Learning Accelerator (DLA) can be configured with sufficient logic units to process the input data provided to an Artificial Neural Network (ANN) and generate the output of the Artificial Neural Network (ANN) according to a set of instructions generated for the Deep Learning Accelerator (DLA). Thus, the Deep Learning Accelerator (DLA) can perform the computation of an Artificial Neural Network (ANN) with little or no help from a Central Processing Unit (CPU) or another processor. Optionally, a conventional general purpose processor can also be configured as part of the Deep Learning Accelerator (DLA) to perform operations that cannot be implemented efficiently using the vector/matrix processing units of the Deep Learning Accelerator (DLA), and/or that cannot be performed by the vector/matrix processing units of the Deep Learning Accelerator (DLA).

A typical Artificial Neural Network (ANN) can be described/specified in a standard format (e.g., Open Neural Network Exchange (ONNX)). A compiler can be used to convert the description of the Artificial Neural Network (ANN) into a set of instructions for the Deep Learning Accelerator (DLA) to perform calculations of the Artificial Neural Network (ANN). The compiler can optimize the set of instructions to improve the performance of the Deep Learning Accelerator (DLA) in implementing the Artificial Neural Network (ANN).

The Deep Learning Accelerator (DLA) can have local memory, such as registers, buffers and/or caches, configured to store vector/matrix operands and the results of vector/matrix operations. Intermediate results in the registers can be pipelined/shifted in the Deep Learning Accelerator (DLA) as operands for subsequent vector/matrix operations to reduce time and energy consumption in accessing memory/data and thus speed up typical patterns of vector/matrix operations in implementing a typical Artificial Neural Network (ANN).

The capacity of registers, buffers and/or caches in the Deep Learning Accelerator (DLA) is typically insufficient to hold the entire data set for implementing the computation of a typical Artificial Neural Network (ANN). Thus, a random access memory coupled to the Deep Learning Accelerator (DLA) is configured to provide an improved data storage capability for implementing a typical Artificial Neural Network (ANN). For example, the Deep Learning Accelerator (DLA) loads data and instructions from the random access memory and stores results back into the random access memory.

The communication bandwidth between the Deep Learning Accelerator (DLA) and the random access memory is configured to optimize or maximize the utilization of the computation power of the Deep Learning Accelerator (DLA). For example, high communication bandwidth can be provided between the Deep Learning Accelerator (DLA) and the random access memory such that vector/matrix operands can be loaded from the random access memory into the Deep Learning Accelerator (DLA) and results stored back into the random access memory in a time period that is approximately equal to the time for the Deep Learning Accelerator (DLA) to perform the computations on the vector/matrix operands. The granularity of the Deep Learning Accelerator (DLA) can be configured to increase the ratio between the amount of computations performed by the Deep Learning Accelerator (DLA) and the size of the vector/matrix operands such that the data access traffic between the Deep Learning Accelerator (DLA) and the random access memory can be reduced, which can reduce the requirement on the communication bandwidth between the Deep Learning Accelerator (DLA) and the random access memory. Thus, the bottleneck in data/memory access can be reduced or eliminated.

In at least some embodiments, an integrated sensor device is configured to have at least one sensor, the Deep Learning Accelerator (DLA) and the random access memory.

For example, the sensor can be configured in an integrated circuit device having the Deep Learning Accelerator (DLA) and the random access memory. Alternatively, the sensor can be connected, through a printed circuit board, with an integrated circuit device having the Deep Learning Accelerator (DLA) and the random access memory to form a compact package.

The integrated sensor device can be customized for a particular application of Artificial Intelligence (AI) by storing a model of an Artificial Neural Network (ANN) executable by the Deep Learning Accelerator (DLA). For example, the model can be converted from a description of the Artificial Neural Network (ANN) using a compiler; and the model includes weight/kernel matrices of the Artificial Neural Network (ANN) and instructions with matrix operands, executable by the Deep Learning Accelerator (DLA) to implement the computation of the Artificial Neural Network (ANN) based on the weight/kernel matrices.

After the sensor device is customized through storing the model in the random access memory to perform the computations of the Artificial Neural Network (ANN), the raw sensor data generated by the at least one sensor in the integrated sensor device is provided as input to the Artificial Neural Network (ANN); and the outputs of the Artificial Neural Network (ANN) can be provided as the primary output of the integrated sensor device. Storing the model of the Artificial Neural Network (ANN) converts the integrated sensor device into an intelligent, special-purpose sensor device that outputs inference results derived from the measurements generated by the sensor(s).

For example, the integrated sensor device can provide, to a host system and without assistance from the host system, intelligent outputs that are generated locally in the integrated sensor device using the Artificial Neural Network (ANN). For example, the integrated sensor device can include a microphone and configured to directly output recognized text, instead of sensed sound or audio signals. For example, the integrated sensor device can include an image sensor and configured to directly output identifications, classifications and/or features of recognized objects shown in the images, instead of the raw images of the scene containing the objects.

Optionally, the integrated sensor device caches or buffers the input data to the Artificial Neural Network (ANN) for a period of time, such that upon requests from the host system, the integrated sensor device can provide the input data (e.g., the sound/audio signals or images) to the host system for further analysis.

The random access memory in the integrated sensor device can include a portion configured to store input to the Artificial Neural Network (ANN) and another portion configured to store output from the Artificial Neural Network (ANN). The data generated by the sensor in the integrated sensor device, such as sound or audio signals and/or images, can be stored in a cyclic way in the input portion of the random access memory. Thus, the raw sensor data for the latest period of the operation of the integrated sensor device can be found in the input portion of the random access memory. The Deep Learning Accelerator (DLA) converts, in real time, the data in the input portion into inference results stored in the output portion of the random access memory.

For example, a stream of sensor input data to the Artificial Neural Network (ANN) can be configured in the form of a sequence of input data sets. Each input data set is for a set of input to the Artificial Neural Network (ANN) during a time slot. While the Deep Learning Accelerator (DLA) is computing the output from the current set of input, a controller can store the next set of input into the random access memory; and the controller can concurrently retrieve, from the random access memory, the output generated for the previous set of input.

Thus, the task of preparation and processing of input data to an Artificial Neural Network (ANN) from a sensor can be offloaded from the host system of the sensor device. The integrated sensor device having the Deep Learning Accelerator (DLA) and random access memory can function as an independent supplier of results from an Artificial Neural Network (ANN) to the host system, such as a Central Processing Unit (CPU). The host system can retrieve a set of output at a time when the output is needed. The host system can instruct the integrated sensor device to pause its operations when output from the Artificial Neural Network (ANN) is not required. Subsequently, when output from the Artificial Neural Network (ANN) is needed, the host system can instruct the integrated circuit device to resume its operations of generating high level sensor outputs defined by the Artificial Neural Network (ANN).

FIG. 1 shows an integrated circuit device (101) having a Deep Learning Accelerator (103) and random access memory (105) configured according to one embodiment.

The Deep Learning Accelerator (103) in FIG. 1 includes processing units (111), a control unit (113), and local memory (115). When vector and matrix operands are in the local memory (115), the control unit (113) can use the processing units (111) to perform vector and matrix operations in accordance with instructions. Further, the control unit (113) can load instructions and operands from the random access memory (105) through a memory interface (117) and a high speed/bandwidth connection (119).

The integrated circuit device (101) is configured to be enclosed within an integrated circuit package with pins or contacts for a memory controller interface (127).

The memory controller interface (127) is configured to support a standard memory access protocol such that the integrated circuit device (101) appears to a typical memory controller in a way same as a conventional random access memory device having no Deep Learning Accelerator (DLA) (103). For example, a memory controller external to the integrated circuit device (101) can access, using a standard memory access protocol through the memory controller interface (127), the random access memory (105) in the integrated circuit device (101).

The integrated circuit device (101) is configured with a high bandwidth connection (119) between the random access memory (105) and the Deep Learning Accelerator (DLA) (103) that are enclosed within the integrated circuit device (101). The bandwidth of the connection (119) is higher than the bandwidth of the connection (109) between the random access memory (105) and the memory controller interface (127).

In one embodiment, both the memory controller interface (127) and the memory interface (117) are configured to access the random access memory (105) via a same set of buses or wires. Thus, the bandwidth to access the random access memory (105) is shared between the memory interface (117) and the memory controller interface (127). Alternatively, the memory controller interface (127) and the memory interface (117) are configured to access the random access memory (105) via separate sets of buses or wires. Optionally, the random access memory (105) can include multiple sections that can be accessed concurrently via the connection (119). For example, when the memory interface (117) is accessing a section of the random access memory (105), the memory control interface (127) can concurrently access another section of the random access memory (105). For example, the different sections can be configured on different integrated circuit dies and/or different planes/banks of memory cells; and the different sections can be accessed in parallel to increase throughput in accessing the random access memory (105). For example, the memory controller interface (127) is configured to access one data unit of a predetermined size at a time; and the memory interface (117) is configured to access multiple data units, each of the same predetermined size, at a time.

In one embodiment, the random access memory (105) and the integrated circuit device (101) are configured on different integrated circuit dies configured within a same integrated circuit package. Further, the random access memory (105) can be configured on one or more integrated circuit dies that allows parallel access of multiple data elements concurrently.

In some implementations, the number of data elements of a vector or matrix that can be accessed in parallel over the connection (119) corresponds to the granularity of the Deep Learning Accelerator (DLA) operating on vectors or matrices. For example, when the processing units (111) can operate on a number of vector/matrix elements in parallel, the connection (119) is configured to load or store the same number, or multiples of the number, of elements via the connection (119) in parallel.

Optionally, the data access speed of the connection (119) can be configured based on the processing speed of the Deep Learning Accelerator (DLA) (103). For example, after an amount of data and instructions have been loaded into the local memory (115), the control unit (113) can execute an instruction to operate on the data using the processing units (111) to generate output. Within the time period of processing to generate the output, the access bandwidth of the connection (119) allows the same amount of data and instructions to be loaded into the local memory (115) for the next operation and the same amount of output to be stored back to the random access memory (105). For example, while the control unit (113) is using a portion of the local memory (115) to process data and generate output, the memory interface (117) can offload the output of a prior operation into the random access memory (105) from, and load operand data and instructions into, another portion of the local memory (115). Thus, the utilization and performance of the Deep Learning Accelerator (DLA) are not restricted or reduced by the bandwidth of the connection (119).

The random access memory (105) can be used to store the model data of an Artificial Neural Network (ANN) and to buffer input data for the Artificial Neural Network (ANN). The model data does not change frequently. The model data can include the output generated by a compiler for the Deep Learning Accelerator (DLA) to implement the Artificial Neural Network (ANN). The model data typically includes matrices used in the description of the Artificial Neural Network (ANN) and instructions generated for the Deep Learning Accelerator (DLA) (103) to perform vector/matrix operations of the Artificial Neural Network (ANN) based on vector/matrix operations of the granularity of the Deep Learning Accelerator (DLA) (103). The instructions operate not only on the vector/matrix operations of the Artificial Neural Network (ANN), but also on the input data for the Artificial Neural Network (ANN).

In one embodiment, when the input data is loaded or updated in the random access memory (105), the control unit (113) of the Deep Learning Accelerator (DLA) (103) can automatically execute the instructions for the Artificial Neural Network (ANN) to generate an output of the Artificial Neural Network (ANN). The output is stored into a predefined region in the random access memory (105). The Deep Learning Accelerator (DLA) (103) can execute the instructions without help from a Central Processing Unit (CPU). Thus, communications for the coordination between the Deep Learning Accelerator (DLA) (103) and a processor outside of the integrated circuit device (101) (e.g., a Central Processing Unit (CPU)) can be reduced or eliminated.

Optionally, the logic circuit of the Deep Learning Accelerator (DLA) (103) can be implemented via Complementary Metal Oxide Semiconductor (CMOS). For example, the technique of CMOS Under the Array (CUA) of memory cells of the random access memory (105) can be used to implement the logic circuit of the Deep Learning Accelerator (DLA) (103), including the processing units (111) and the control unit (113). Alternatively, the technique of CMOS in the Array of memory cells of the random access memory (105) can be used to implement the logic circuit of the Deep Learning Accelerator (DLA) (103).

In some implementations, the Deep Learning Accelerator (DLA) (103) and the random access memory (105) can be implemented on separate integrated circuit dies and connected using Through-Silicon Vias (TSV) for increased data bandwidth between the Deep Learning Accelerator (DLA) (103) and the random access memory (105). For example, the Deep Learning Accelerator (DLA) (103) can be formed on an integrated circuit die of a Field-Programmable Gate Array (FPGA) or Application Specific Integrated circuit (ASIC).

Alternatively, the Deep Learning Accelerator (DLA) (103) and the random access memory (105) can be configured in separate integrated circuit packages and connected via multiple point-to-point connections on a printed circuit board (PCB) for parallel communications and thus increased data transfer bandwidth.

The random access memory (105) can be volatile memory or non-volatile memory, or a combination of volatile memory and non-volatile memory. Examples of non-volatile memory include flash memory, memory cells formed based on negative-and (NAND) logic gates, negative-or (NOR) logic gates, Phase-Change Memory (PCM), magnetic memory (MRAM), resistive random-access memory, cross point storage and memory devices. A cross point memory device can use transistor-less memory elements, each of which has a memory cell and a selector that are stacked together as a column. Memory element columns are connected via two layers of wires running in perpendicular directions, where wires of one layer run in one direction in the layer that is located above the memory element columns, and wires of the other layer run in another direction and are located below the memory element columns. Each memory element can be individually selected at a cross point of one wire on each of the two layers. Cross point memory devices are fast and non-volatile and can be used as a unified memory pool for processing and storage. Further examples of non-volatile memory include Read-Only Memory (ROM), Programmable Read-Only Memory (PROM), Erasable Programmable Read-Only Memory (EPROM) and Electronically Erasable Programmable Read-Only Memory (EEPROM) memory, etc. Examples of volatile memory include Dynamic Random-Access Memory (DRAM) and Static Random-Access Memory (SRAM).

For example, non-volatile memory can be configured to implement at least a portion of the random access memory (105). The non-volatile memory in the random access memory (105) can be used to store the model data of an Artificial Neural Network (ANN). Thus, after the integrated circuit device (101) is powered off and restarts, it is not necessary to reload the model data of the Artificial Neural Network (ANN) into the integrated circuit device (101). Further, the non-volatile memory can be programmable/rewritable. Thus, the model data of the Artificial Neural Network (ANN) in the integrated circuit device (101) can be updated or replaced to implement an update Artificial Neural Network (ANN), or another Artificial Neural Network (ANN).

The processing units (111) of the Deep Learning Accelerator (DLA) (103) can include vector-vector units, matrix-vector units, and/or matrix-matrix units. Examples of units configured to perform for vector-vector operations, matrix-vector operations, and matrix-matrix operations are discussed below in connection with FIGS. 2-4.

Figure 2:
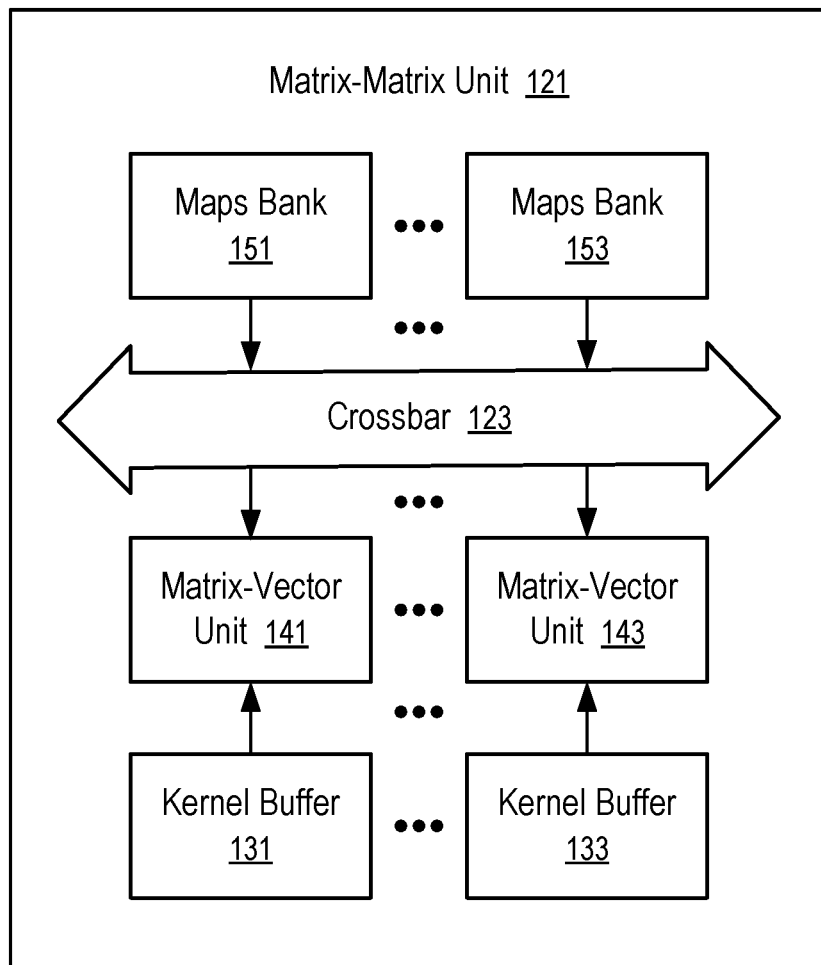
FIG. 2 shows a processing unit configured to perform matrix-matrix operations according to one embodiment.

FIG. 2 shows a processing unit (121) configured to perform matrix-matrix operations according to one embodiment. For example, the matrix-matrix unit (121) of FIG. 2 can be used as one of the processing units (111) of the Deep Learning Accelerator (DLA) (103) of FIG. 1.

In FIG. 2, the matrix-matrix unit (121) includes multiple kernel buffers (131 to 133) and multiple the maps banks (151 to 153). Each of the maps banks (151 to 153) stores one vector of a matrix operand that has multiple vectors stored in the maps banks (151 to 153) respectively; and each of the kernel buffers (131 to 133) stores one vector of another matrix operand that has multiple vectors stored in the kernel buffers (131 to 133) respectively. The matrix-matrix unit (121) is configured to perform multiplication and accumulation operations on the elements of the two matrix operands, using multiple matrix-vector units (141 to 143) that operate in parallel.

A cross bar (123) connects the maps banks (151 to 153) to the matrix-vector units (141 to 143). The same matrix operand stored in the maps bank (151 to 153) is provided via the crossbar (123) to each of the matrix-vector units (141 to 143); and the matrix-vector units (141 to 143) receives data elements from the maps banks (151 to 153) in parallel. Each of the kernel buffers (131 to 133) is connected to a respective one in the matrix-vector units (141 to 143) and provides a vector operand to the respective matrix-vector unit. The matrix-vector units (141 to 143) operate concurrently to compute the operation of the same matrix operand, stored in the maps banks (151 to 153) multiplied by the corresponding vectors stored in the kernel buffers (131 to 133). For example, the matrix-vector unit (141) performs the multiplication operation on the matrix operand stored in the maps banks (151 to 153) and the vector operand stored in the kernel buffer (131), while the matrix-vector unit (143) is concurrently performing the multiplication operation on the matrix operand stored in the maps banks (151 to 153) and the vector operand stored in the kernel buffer (133).

Figure 3:
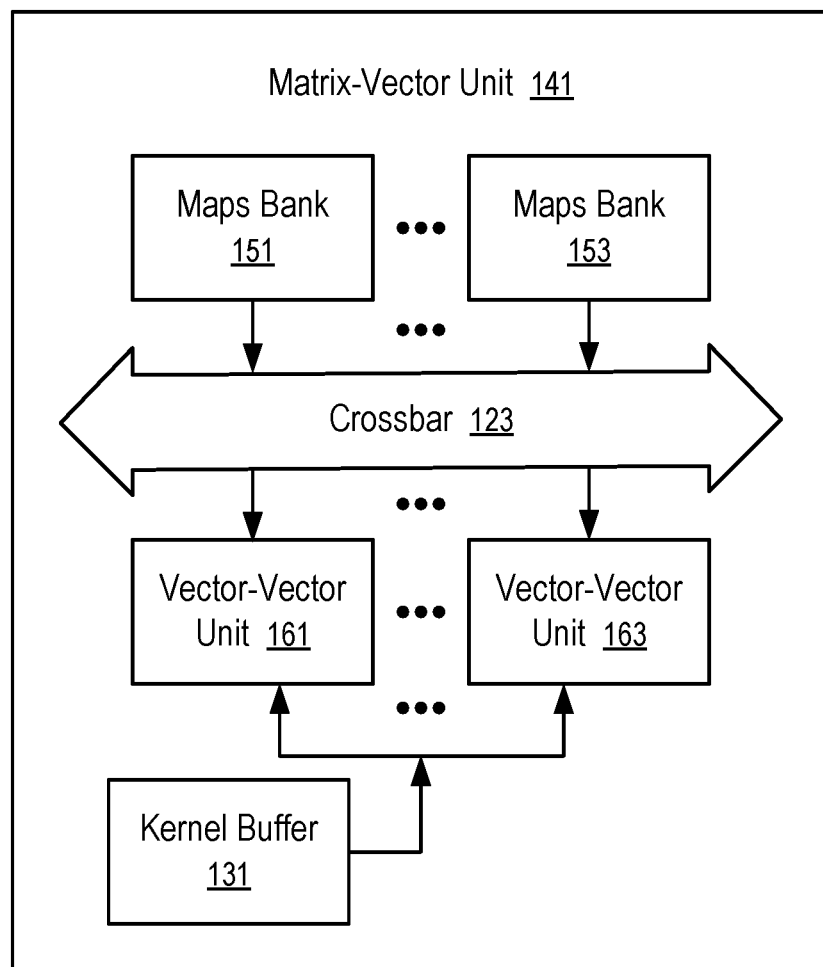
FIG. 3 shows a processing unit configured to perform matrix-vector operations according to one embodiment.

Each of the matrix-vector units (141 to 143) in FIG. 2 can be implemented in a way as illustrated in FIG. 3.

FIG. 3 shows a processing unit (141) configured to perform matrix-vector operations according to one embodiment. For example, the matrix-vector unit (141) of FIG. 3 can be used as any of the matrix-vector units in the matrix-matrix unit (121) of FIG. 2.

In FIG. 3, each of the maps banks (151 to 153) stores one vector of a matrix operand that has multiple vectors stored in the maps banks (151 to 153) respectively, in a way similar to the maps banks (151 to 153) of FIG. 2. The crossbar (123) in FIG. 3 provides the vectors from the maps banks (151) to the vector-vector units (161 to 163) respectively. A same vector stored in the kernel buffer (131) is provided to the vector-vector units (161 to 163).

The vector-vector units (161 to 163) operate concurrently to compute the operation of the corresponding vector operands, stored in the maps banks (151 to 153) respectively, multiplied by the same vector operand that is stored in the kernel buffer (131). For example, the vector-vector unit (161) performs the multiplication operation on the vector operand stored in the maps bank (151) and the vector operand stored in the kernel buffer (131), while the vector-vector unit (163) is concurrently performing the multiplication operation on the vector operand stored in the maps bank (153) and the vector operand stored in the kernel buffer (131).

When the matrix-vector unit (141) of FIG. 3 is implemented in a matrix-matrix unit (121) of FIG. 2, the matrix-vector unit (141) can use the maps banks (151 to 153), the crossbar (123) and the kernel buffer (131) of the matrix-matrix unit (121).

Figure 4:
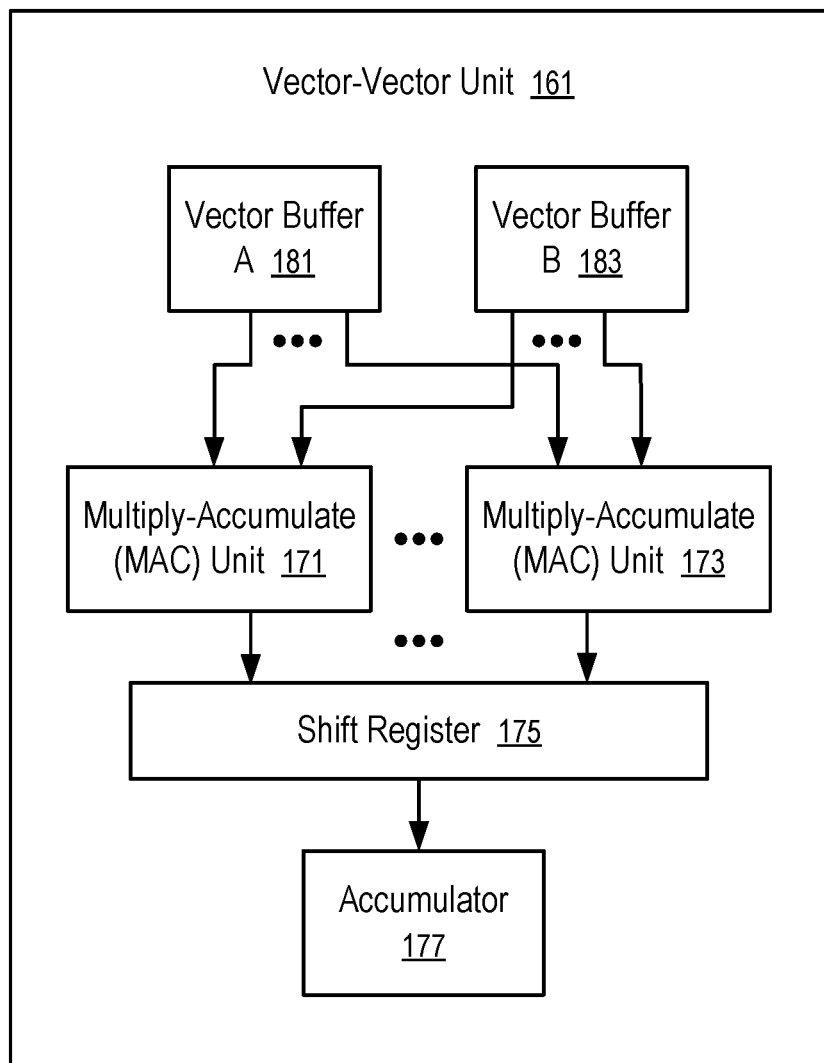
FIG. 4 shows a processing unit configured to perform vector-vector operations according to one embodiment.

Each of the vector-vector units (161 to 163) in FIG. 3 can be implemented in a way as illustrated in FIG. 4.

FIG. 4 shows a processing unit (161) configured to perform vector-vector operations according to one embodiment. For example, the vector-vector unit (161) of FIG. 4 can be used as any of the vector-vector units in the matrix-vector unit (141) of FIG. 3.

In FIG. 4, the vector-vector unit (161) has multiple multiply-accumulate (MAC) units (171 to 173). Each of the multiply-accumulate (MAC) units (171 to 173) can receive two numbers as operands, perform multiplication of the two numbers, and add the result of the multiplication to a sum maintained in the multiply-accumulate (MAC) unit.

Each of the vector buffers (181 and 183) stores a list of numbers. A pair of numbers, each from one of the vector buffers (181 and 183), can be provided to each of the multiply-accumulate (MAC) units (171 to 173) as input. The multiply-accumulate (MAC) units (171 to 173) can receive multiple pairs of numbers from the vector buffers (181 and 183) in parallel and perform the multiply-accumulate (MAC) operations in parallel. The outputs from the multiply-accumulate (MAC) units (171 to 173) are stored into the shift register (175); and an accumulator (177) computes the sum of the results in the shift register (175).

When the vector-vector unit (161) of FIG. 4 is implemented in a matrix-vector unit (141) of FIG. 3, the vector-vector unit (161) can use a maps bank (e.g., 151 or 153) as one vector buffer (181), and the kernel buffer (131) of the matrix-vector unit (141) as another vector buffer (183).

The vector buffers (181 and 183) can have a same length to store the same number/count of data elements. The length can be equal to, or the multiple of, the count of multiply-accumulate (MAC) units (171 to 173) in the vector-vector unit (161). When the length of the vector buffers (181 and 183) is the multiple of the count of multiply-accumulate (MAC) units (171 to 173), a number of pairs of inputs, equal to the count of the multiply-accumulate (MAC) units (171 to 173), can be provided from the vector buffers (181 and 183) as inputs to the multiply-accumulate (MAC) units (171 to 173) in each iteration; and the vector buffers (181 and 183) feed their elements into the multiply-accumulate (MAC) units (171 to 173) through multiple iterations.

In one embodiment, the communication bandwidth of the connection (119) between the Deep Learning Accelerator (DLA) (103) and the random access memory (105) is sufficient for the matrix-matrix unit (121) to use portions of the random access memory (105) as the maps banks (151 to 153) and the kernel buffers (131 to 133).

In another embodiment, the maps banks (151 to 153) and the kernel buffers (131 to 133) are implemented in a portion of the local memory (115) of the Deep Learning Accelerator (DLA) (103). The communication bandwidth of the connection (119) between the Deep Learning Accelerator (DLA) (103) and the random access memory (105) is sufficient to load, into another portion of the local memory (115), matrix operands of the next operation cycle of the matrix-matrix unit (121), while the matrix-matrix unit (121) is performing the computation in the current operation cycle using the maps banks (151 to 153) and the kernel buffers (131 to 133) implemented in a different portion of the local memory (115) of the Deep Learning Accelerator (DLA) (103).

Figure 5:
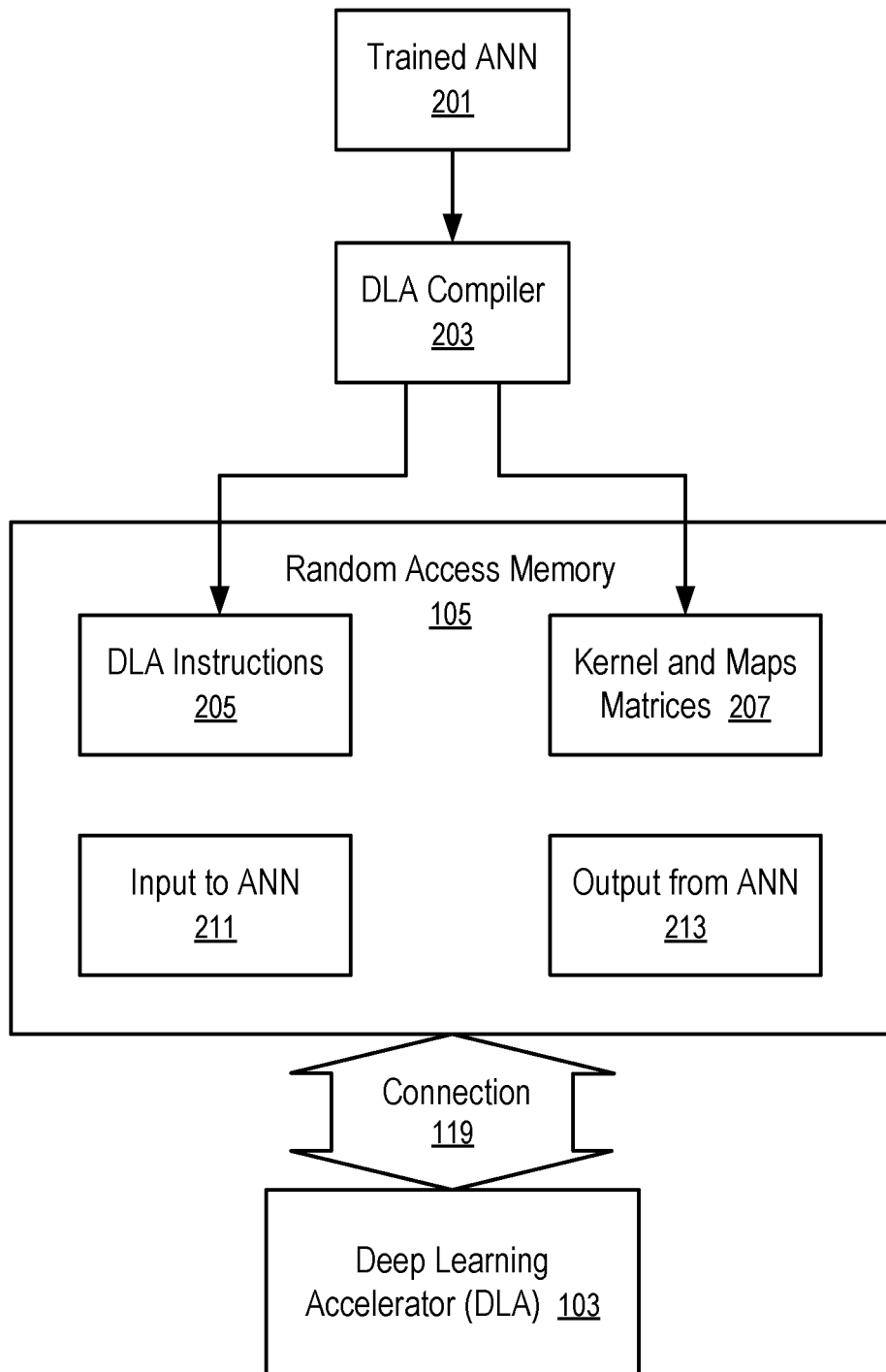
FIG. 5 shows a Deep Learning Accelerator and random access memory configured to autonomously apply inputs to a trained Artificial Neural Network according to one embodiment.

FIG. 5 shows a Deep Learning Accelerator and random access memory configured to autonomously apply inputs to a trained Artificial Neural Network according to one embodiment.

An Artificial Neural Network (ANN) (201) that has been trained through machine learning (e.g., deep learning) can be described in a standard format (e.g., Open Neural Network Exchange (ONNX)). The description of the trained ANN (201) in the standard format identifies the properties of the artificial neurons and their connectivity.

In FIG. 5, a Deep Learning Accelerator (DLA) compiler (203) converts trained ANN (201) by generating instructions (205) for a Deep Learning Accelerator (DLA) (103) and matrices (207) corresponding to the properties of the artificial neurons and their connectivity. The instructions (205) and the matrices (207) generated by the DLA compiler (203)

from the trained ANN (201) can be stored in random access memory (105) for the Deep Learning Accelerator (DLA) (103).

For example, the random access memory (105) and the Deep Learning Accelerator (DLA) (103) can be connected via a high bandwidth connection (119) in a way as in the integrated circuit device (101) of FIG. 1. The autonomous computation of FIG. 5 based on the instructions (205) and the matrices (207) can be implemented in the integrated circuit device (101) of FIG. 1. Alternatively, the random access memory (105) and the Deep Learning Accelerator (DLA) (103) can be configured on a printed circuit board with multiple point to point serial buses running in parallel to implement the connection (119).

In FIG. 5, after the results of the DLA compiler (203) are stored in the random access memory (105), the application of the trained ANN (201) to process an input (211) to the trained ANN (201) to generate the corresponding output (213) of the trained ANN (213) can be triggered by the presence of the input (211) in the random access memory (105), or another indication provided in the random access memory (105).

In response, the Deep Learning Accelerator (DLA) (103) executes the instructions (205) to combine the input (211) and the matrices (207). The execution of the instructions (205) can include the generation of maps matrices for the maps banks (151 to 153) of one or more matrix-matrix units (e.g., 121) of the Deep Learning Accelerator (DLA) (103).

In some embodiments, the inputs to ANN (211) is in the form of an initial maps matrix. Portions of the initial maps matrix can be retrieved from the random access memory (105) as the matrix operand stored in the maps banks (151 to 153) of a matrix-matrix unit (121). Alternatively, the DLA instructions (205) also include instructions for the Deep Learning Accelerator (DLA) (103) to generate the initial maps matrix from the input (211).

According to the DLA instructions (205), the Deep Learning Accelerator (DLA) (103) loads matrix operands into the kernel buffers (131 to 133) and maps banks (151 to 153) of its matrix-matrix unit (121). The matrix-matrix unit (121) performs the matrix computation on the matrix operands. For example, the DLA instructions (205) break down matrix computations of the trained ANN (201) according to the computation granularity of the Deep Learning Accelerator (DLA) (103) (e.g., the sizes/dimensions of matrices that loaded as matrix operands in the matrix-matrix unit (121)) and applies the input feature maps to the kernel of a layer of artificial neurons to generate output as the input for the next layer of artificial neurons.

Upon completion of the computation of the trained ANN (201) performed according to the instructions (205), the Deep Learning Accelerator (DLA) (103) stores the output (213) of the ANN (201) at a pre-defined location in the random access memory (105), or at a location specified in an indication provided in the random access memory (105) to trigger the computation.

When the technique of FIG. 5 is implemented in the integrated circuit device (101) of FIG. 1, an external device connected to the memory controller interface (127) can write the input (211) into the random access memory (105) and trigger the autonomous computation of applying the input (211) to the trained ANN (201) by the Deep Learning Accelerator (DLA) (103). After a period of time, the output (213) is available in the random access memory (105); and the external device can read the output (213) via the memory controller interface (127) of the integrated circuit device (101).

For example, a predefined location in the random access memory (105) can be configured to store an indication to trigger the autonomous execution of the instructions (205) by the Deep Learning Accelerator (DLA) (103). The indication can optionally include a location of the input (211) within the random access memory (105). Thus, during the autonomous execution of the instructions (205) to process the input (211), the external device can retrieve the output generated during a previous run of the instructions (205), and/or store another set of input for the next run of the instructions (205).

Optionally, a further predefined location in the random access memory (105) can be configured to store an indication of the progress status of the current run of the instructions (205). Further, the indication can include a prediction of the completion time of the current run of the instructions (205) (e.g., estimated based on a prior run of the instructions (205)). Thus, the external device can check the completion status at a suitable time window to retrieve the output (213).

In some embodiments, the random access memory (105) is configured with sufficient capacity to store multiple sets of inputs (e.g., 211) and outputs (e.g., 213). Each set can be configured in a predetermined slot/area in the random access memory (105).

The Deep Learning Accelerator (DLA) (103) can execute the instructions (205) autonomously to generate the output (213) from the input (211) according to matrices (207) stored in the random access memory (105) without helps from a processor or device that is located outside of the integrated circuit device (101).

In a method according to one embodiment, random access memory (105) of a computing device (e.g., 101) can be accessed using an interface (127) of the computing device (e.g., 101) to a memory controller. The computing device (e.g., 101) can have processing units (e.g., 111) configured to perform at least computations on matrix operands, such as a matrix operand stored in maps banks (151 to 153) and a matrix operand stored in kernel buffers (131 to 133).

For example, the computing device (e.g., 101) can be enclosed within an integrated circuit package; and a set of connections can connect the interface (127) to the memory controller that is located outside of the integrated circuit package.

Instructions (205) executable by the processing units (e.g., 111) can be written into the random access memory (105) through the interface (127).

Matrices (207) of an Artificial Neural Network (201) can be written into the random access memory (105) through the interface (127). The matrices (207) identify the property and/or state of the Artificial Neural Network (201).

Optionally, at least a portion of the random access memory (105) is non-volatile and configured to store the instructions (205) and the matrices (207) of the Artificial Neural Network (201).

First input (211) to the Artificial Neural Network can be written into the random access memory (105) through the interface (127).

An indication is provided in the random access memory (105) to cause the processing units (111) to start execution of the instructions (205). In response to the indication, the processing units (111) execute the instructions to combine the first input (211) with the matrices (207) of the Artificial Neural Network (201) to generate first output (213) from the Artificial Neural Network (201) and store the first output (213) in the random access memory (105).

For example, the indication can be an address of the first input (211) in the random access memory (105); and the indication can be stored a predetermined location in the random access memory (105) to cause the initiation of the execution of the instructions (205) for the input (211) identified by the address. Optionally, the indication can also include an address for storing the output (213).

The first output (213) can be read, through the interface (127), from the random access memory (105).

For example, the computing device (e.g., 101) can have a Deep Learning Accelerator (103) formed on a first integrated circuit die and the random access memory (105) formed on one or more second integrated circuit dies. The connection (119) between the first integrated circuit die and the one or more second integrated circuit dies can include Through-Silicon Vias (TSVs) to provide high bandwidth for memory access.

For example, a description of the Artificial Neural Network (201) can be converted using a compiler (203) into the instructions (205) and the matrices (207). The combination of the instructions (205) and the matrices (207) stored in the random access memory (105) and the Deep Learning Accelerator (103) provides an autonomous implementation of the Artificial Neural Network (201) that can automatically convert input (211) to the Artificial Neural Network (201) to its output (213).

For example, during a time period in which the Deep Learning Accelerator (103) executes the instructions (205) to generate the first output (213) from the first input (211) according to the matrices (207) of the Artificial Neural Network (201), the second input to Artificial Neural Network (201) can be written into the random access memory (105) through the interface (127) at an alternative location. After the first output (213) is stored in the random access memory (105), an indication can be provided in the random access memory to cause the Deep Learning Accelerator (103) to again start the execution of the instructions and generate second output from the second input.

During the time period in which the Deep Learning Accelerator (103) executes the instructions (205) to generate the second output from the second input according to the matrices (207) of the Artificial Neural Network (201), the first output (213) can be read from the random access memory (105) through the interface (127); and a further input can be written into the random access memory to replace the first input (211), or written at a different location. The process can be repeated for a sequence of inputs.

The Deep Learning Accelerator (103) can include at least one matrix-matrix unit (121) that can execute an instruction on two matrix operands. The two matrix operands can be a first matrix and a second matrix. Each of two matrices has a plurality of vectors. The matrix-matrix unit (121) can include a plurality of matrix-vector units (141 to 143) configured to operate in parallel. Each of the matrix-vector units (141 to 143) are configured to operate, in parallel with other matrix-vector units, on the first matrix and one vector from second matrix. Further, each of the matrix-vector units (141 to 143) can have a plurality of vector-vector units (161 to 163) configured to operate in parallel. Each of the vector-vector units (161 to 163) is configured to operate, in parallel with other vector-vector units, on a vector from the first matrix and a common vector operand of the corresponding matrix-vector unit. Further, each of the vector-vector units (161 to 163) can have a plurality of multiply-accumulate units (171 to 173) configured to operate in parallel.

The Deep Learning Accelerator (103) can have local memory (115) and a control unit (113) in addition to the processing units (111). The control unit (113) can load instructions (205) and matrix operands (e.g., 207) from the random access memory (105) for execution by the processing units (111). The local memory can cache matrix operands used by the matrix-matrix unit. The connection (119) can be configured with a bandwidth sufficient to load a set of matrix operands from the random access memory (105) to the local memory (115) during a time period in which the matrix-matrix unit performs operations on two other matrix operands. Further, during the time period, the bandwidth is sufficient to store a result, generated by the matrix-matrix unit (121) in a prior instruction execution, from the local memory (115) to the random access memory (105).

The Deep Learning Accelerator (103) and the random access memory (105) can be combined with one or more sensors to form an integrated sensor device that filters and/or converts the measurements of the sensors using an Artificial Neural Network. For example, a sensor can be built into an integrated circuit device (101) having the Deep Learning Accelerator (103) and the random access memory (105). Alternatively, a sensor is connected to the integrated circuit device (101) on a printed circuit board to form a compact package. The integrated sensor device has a host interface that is accessible by a host system through a peripheral bus, a memory bus, or a network connection.

The integrated sensor device is customizable, updatable, and/or upgradable via storing, through the host interface, into the random access memory (105) the matrices (207) and instructions (205) of an Artificial Neural Network (201).

The Artificial Neural Network (201), implemented via the Deep Learning Accelerator (103) executing the instructions (205), converts the measurements from the sensor(s) into inference results. The conversion improves the quality of outputs of the integrated sensor device, reduces the communication bandwidth requirement for the connection to the host system, and/or reduces the computation workloads of the host system.

For example, the integrated sensor device can convert audio signals into recognized text and/or convert images into recognized objects, events, classifications, features, etc.

Figure 6:
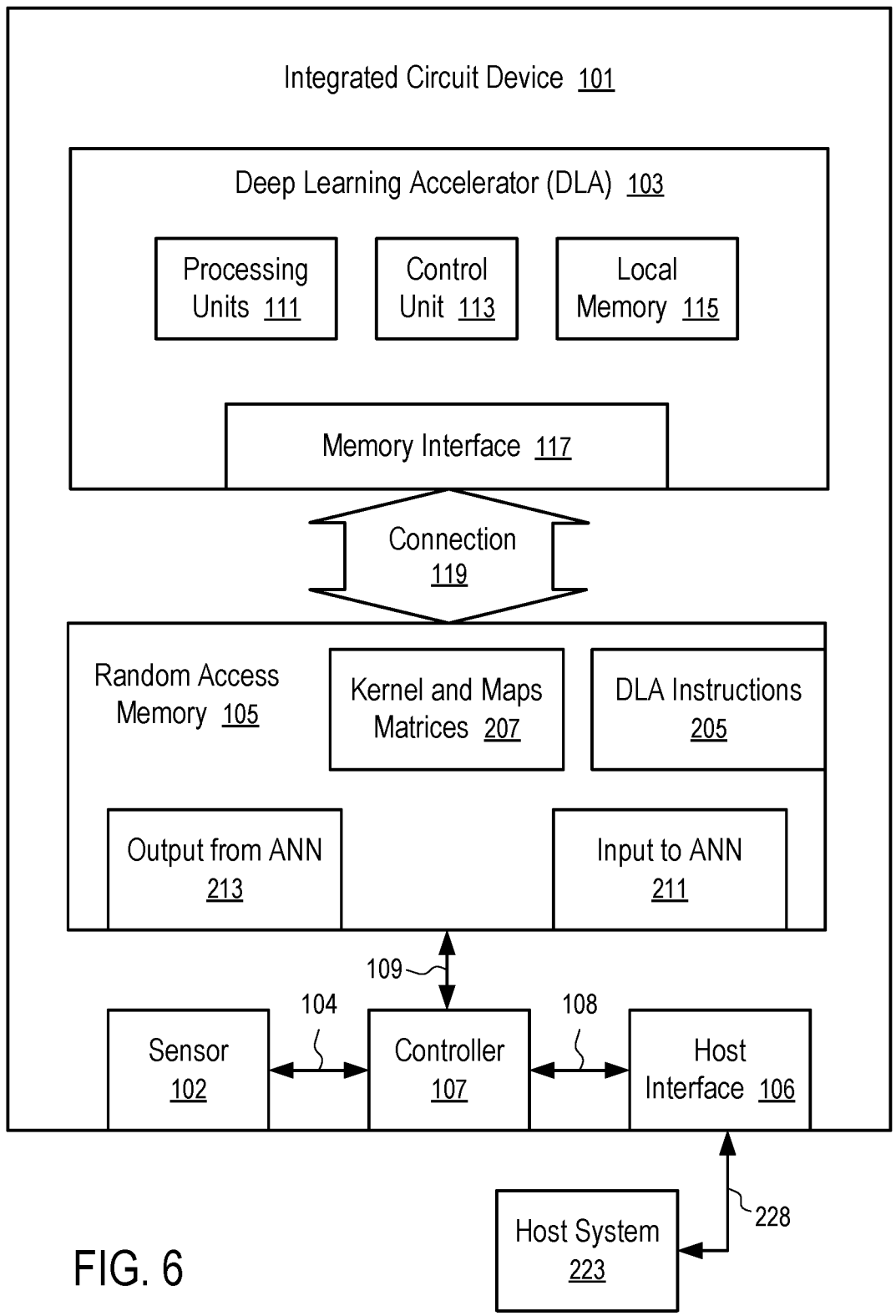
FIG. 6 shows an integrated circuit device having a sensor, a Deep Learning Accelerator and random access memory configured according to one embodiment.

FIG. 6 shows an integrated circuit device (101) having a sensor (102), a Deep Learning Accelerator (103) and random access memory (105) configured according to one embodiment.

For example, the sensor (102) can include a temperature sensor, a current sensor, a voltage sensor, a light sensor, a pressure sensor, a stress sensor, a strain sensor, a touch sensor, and/or an electromechanical device configured to measure acceleration, rotation, infrared radiation, vibration, etc., or any combination thereof.

The sensor (102) of FIG. 6 can be formed on or configured on a substrate of the integrated circuit device (101). The sensor (102) can be enclosed within an integrated circuit package in some implementations. In other implementations, the sensor (102) can be positioned on a surface of the integrated circuit package. For example, the sensor (102) can be configured on a top surface of the integrated circuit package when the pins or contacts of the integrated circuit device (101) are configured on the sides, or at a bottom surface of the integrated circuit device (101).

The integrated circuit device (101) of FIG. 6 has a controller (107) that is configured to control the operations of the sensor (102) via a connection (104) in the integrated circuit device (101). The controller (107) can be implemented, for example, using a microcontroller or a sequencer that controls the timing of the operations of the sensor (102) and loads sensor data/measurements into the random access memory (105). Alternatively, the controller (107) can be implemented using a microprocessor that runs an application stored in the random access memory (105) as firmware to coordinate the operations among the sensor (102), the random access memory (105), the Deep Learning Accelerator (103), and/or a host interface (106).

After a set of sensor data is stored into the random access memory (105) as the input (211) to the Artificial Neural Network (201), the controller (107) can cause the Deep Learning Accelerator (103) to execute the instructions (205) and generate the output (213) of the Artificial Neural Network (201).

For example, the controller (107) can instruct the Deep Learning Accelerator (103) to start the execution of the instructions (205) by writing the address of the input (211) at a predefined location in the random access memory (105). When the Deep Learning Accelerator (103) is in an idle state, the Deep Learning Accelerator (103) can periodically read the address stored at the predefined location in the random access memory (105). When a new and/or valid address is retrieved from the predefined location, the Deep Learning Accelerator (103) starts the execution of the instructions (205). Optionally, after starting the execution of the instructions (205), the Deep Learning Accelerator (103) can optionally clear, erase or invalidate the address previously stored at the predefined location in the random access memory (105).

Alternatively, the controller (107) is configured to send a signal or a message to the Deep Learning Accelerator (103) to instruct the Deep Learning Accelerator (103) to execute the instructions (205). The signal or a message can be transmitted from the controller (107) to the Deep Learning Accelerator (103) using a direct connection that does not go through the memory cells of the random access memory (105).

In some implementations, the controller (107) and the Deep Learning Accelerator (103) have separate connections (109 and 119) to the random access memory (105). When the controller (107) and the Deep Learning Accelerator (103) are not accessing a same block or address of the random access memory (105), the connections (109 and 119) can be used by the controller (107) and the Deep Learning Accelerator (103) in parallel to access different portions of the random access memory (105) simultaneously.

In other implementations, the control unit (113) and the controller (107) can share at least a portion of their circuitry in the Deep Learning Accelerator (103) and use the same memory interface (117) to access the random access memory (105).

The host interface (106) of the integrated circuit device (101) of FIG. 6 is configured to provide the output (213) to a host system (223) via a connection (228), such as a memory bus, a peripheral bus, a computer network, etc.

To reduce the pin count of the integrated circuit device (101), the host interface (106) can be configured to use a serial communication connection to communicate with the host system (223). Alternatively, a parallel communication connection can be used.

For example, the host interface (106) can be configured for a serial connection to a peripheral bus. Alternatively, the host interface (106) can be configured for a parallel connection to a memory bus.

For example, the host interface (106) can be an interface to a Serial Advanced Technology Attachment (SATA) bus, a Peripheral Component Interconnect Express (PCIe) bus, Universal Serial Bus (USB), a Serial Attached SCSI (SAS), a Double Data Rate (DDR) memory bus, a Small Computer System Interface (SCSI) bus, etc. For example, the host interface (106) can include the logic circuit to implement a communication protocol of the bus connected to the host interface (106). For example, when the host interface (106) is a PCIe interface, the host interface (106) can implement a protocol of NVM (Non-Volatile Memory) Express (NVMe). The host interface (106) can use the protocol to pass control, address, data, and other signals between the integrated circuit device (101) and a host system (223).

The host interface (106) can be used by a host system (223) to write data into the random access memory (105), such as the matrices (207) and the instructions (205) of the Artificial Neural Network (201). The host interface (106) can be used by the host system (223) to retrieve the output (213) from the integrated circuit device (101).

For example, when the host system (223) sends a write command to the host interface (106), the controller (107) obtains the write command via the connection (108) to the host interface (106) and executes the write command to store data (e.g., a portion of the matrices (207) or the instructions (205)) into the random access memory (105). When the host system (223) sends a read command to the host interface (106), the controller (107) retrieves data (e.g., a portion of the output (213)) and transmit the retrieve data through the connection (108) and the host interface (106) to the host system (223).

Optionally, the host system (223) can also retrieve the input (211) for further analysis. For example, based on the output (213), the host system (223) may decide to retrieve a portion of the input (211) for further analysis; and one or more commands can be transmitted to the host interface (106) to cause the controller (107) to transmit the selected portion of the input (211) through the host interface (106) to the host system (223).

In some implementations, a simplified communication protocol is used between the integrated circuit device (101) such that it is not necessary for the host system (223) to have visibility into the data placement scheme in the random access memory (105).

For example, the host system (223) can indicate that an amount of data of a predefined category (e.g., the matrices (207), or the instructions (205)) is to be streamed into the integrated circuit device (101); and the controller (107) stores the data in a location in the random access memory (105) and stores configuration parameters for the Deep Learning Accelerator (103) to access the data during its execution of the instructions (205) of the Artificial Neural Network (201).

Similarly, the host system (223) can indicate that data of a predefined category (e.g., the output (213), or the input (211) associated with the output (213)) is to be streamed from the integrated circuit device (101); and the controller (107) retrieves the data from the random access memory (105) and uses the host interface (106) to stream the data to the host system (223).

In some implementations, the controller (107) can proactively report the output (213) to the host system (223). For example, when the Deep Learning Accelerator (103) completes the computation of a set of output (213), the controller (107) generates a message to the host system (223) via the host interface (106) indicating the availability of the output (213). As a response, the host system (223) can optionally accept the transmission of the output (213) immediately, request the delay of the transmission of the output (213) for a period of time, or request the postponement of the generation of the next set of output (213).

In some implementations, the host system (223) can query and manage the storage or placement of data in the random access memory (105).

For example, the host system (223) can issue a command to request the controller (107) to report the capacity of the random access memory (105) of the integrated circuit device (101).

For example, the host system (223) can issue a command to request the controller (107) to report the location and size of a portion of the random access memory (105) configured for a predefined data type (e.g., matrices (207), instructions (205), output (213), input (211)).

For example, the host system (223) can issue a command to request the controller (107) to adjust the location and/or size of a portion of the random access memory (105) configured for a predefined data type (e.g., matrices (207), instructions (205), output (213), input (211)).

Alternatively, the data storage structure in the random access memory (105) of the integrated circuit device (101) is predetermined and fixed (e.g., for simplicity).

With the visibility of the data storage structure in the random access memory (105), a host system (223) can access the random access memory (105) for storing and/or retrieving various types of data (e.g., matrices (207), instructions (205), output (213), input (211)), as if the random access memory (105) were configured in a memory module connected to the host system (223) via a memory bus, or in a storage device connected to the host system (223) via a peripheral bus.

Figure 7:
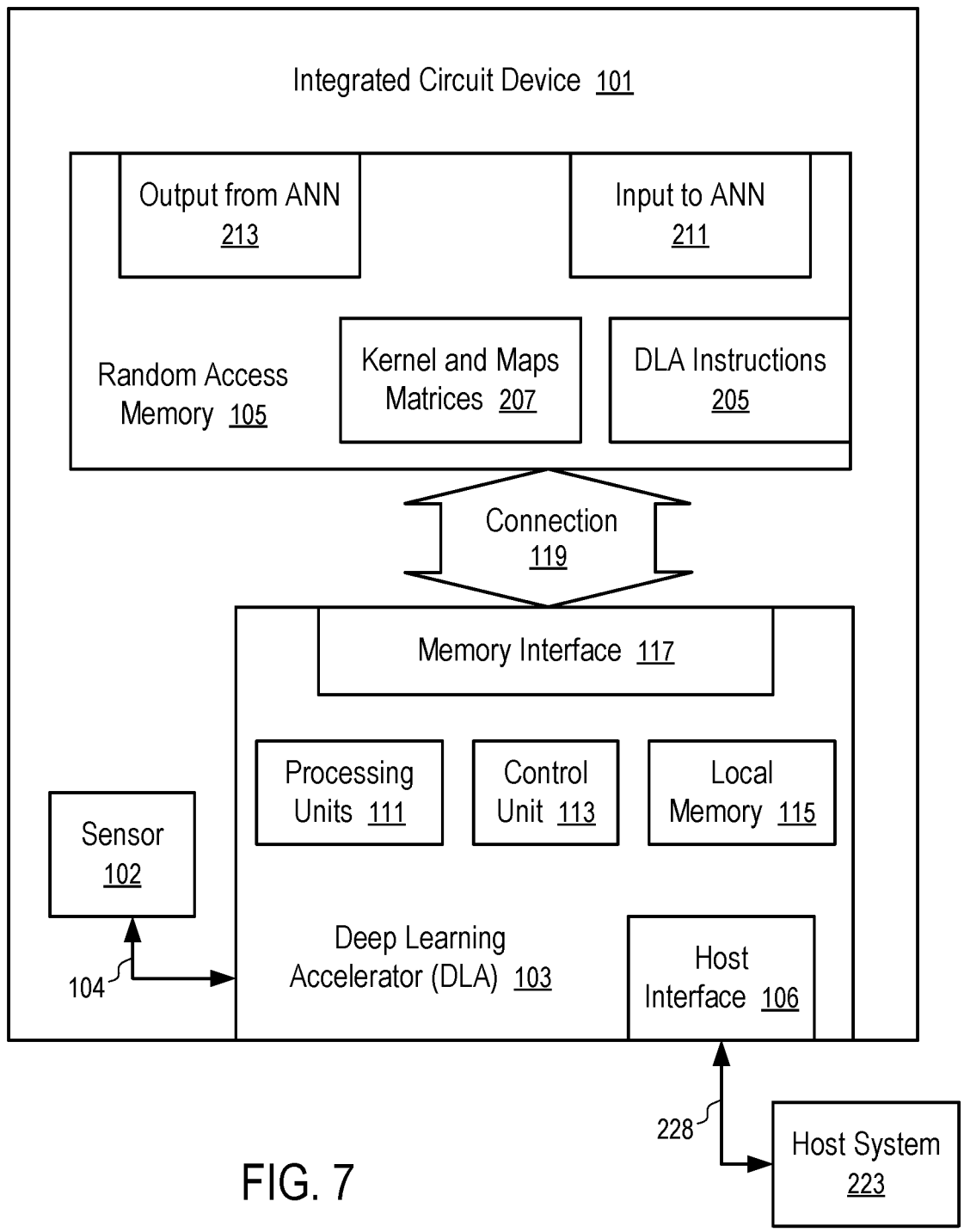
FIG. 7 shows a sensor device configured as an integrated circuit device with a Deep Learning Accelerator and random access memory according to one embodiment.

In some implementations, the control unit (113) of the Deep Learning Accelerator (103) can include the controller (107); and the logic circuit of the host interface (106) can be implemented on the integrated circuit die of the Deep Learning Accelerator (103), as illustrated in FIG. 7.

FIG. 7 shows a sensor device (101) configured as an integrated circuit device (101) with a Deep Learning Accelerator (103) and random access memory (105) according to one embodiment.

In FIG. 7, the Deep Learning Accelerator (103) is configured on an integrated circuit die; and the random access memory (105) is configured on one or more integrated circuit dies. The control unit (113) controls not only the execution of the instructions (205) of the Artificial Neural Network (201), but also the communications of the host interface (106) with the host system (223) and the operations of the sensor (102).

For example, the control unit (113) periodically retrieves measurements from the sensors (102) and stores the measurements into the random access memory (105) through the high bandwidth connection (119).

For example, the control unit (113) can operate the host interface (106) and random access memory (105) in a way similar to a controller of a memory module connected on a memory bus, or a controller of a data storage device connected on a peripheral bus.

Some sensors (102) can be formed on an integrated circuit substrate or an integrated circuit die and thus can be enclosed in an integrated circuit package of an integrated circuit device (101) (e.g., as illustrated in FIG. 6 and FIG. 7).

Alternatively, a sensor (102) can be a discrete component outside of an integrated circuit package that encloses the Deep Learning Accelerator (103) and the random access memory (105).

For example, the sensor (102) and an integrated circuit device (101) having the Deep Learning Accelerator (103) and the random access memory (105) can be mounted on a printed circuit board that has connectors to a cable, a bus, and/or a computer network, of a computer system.

Figure 8:
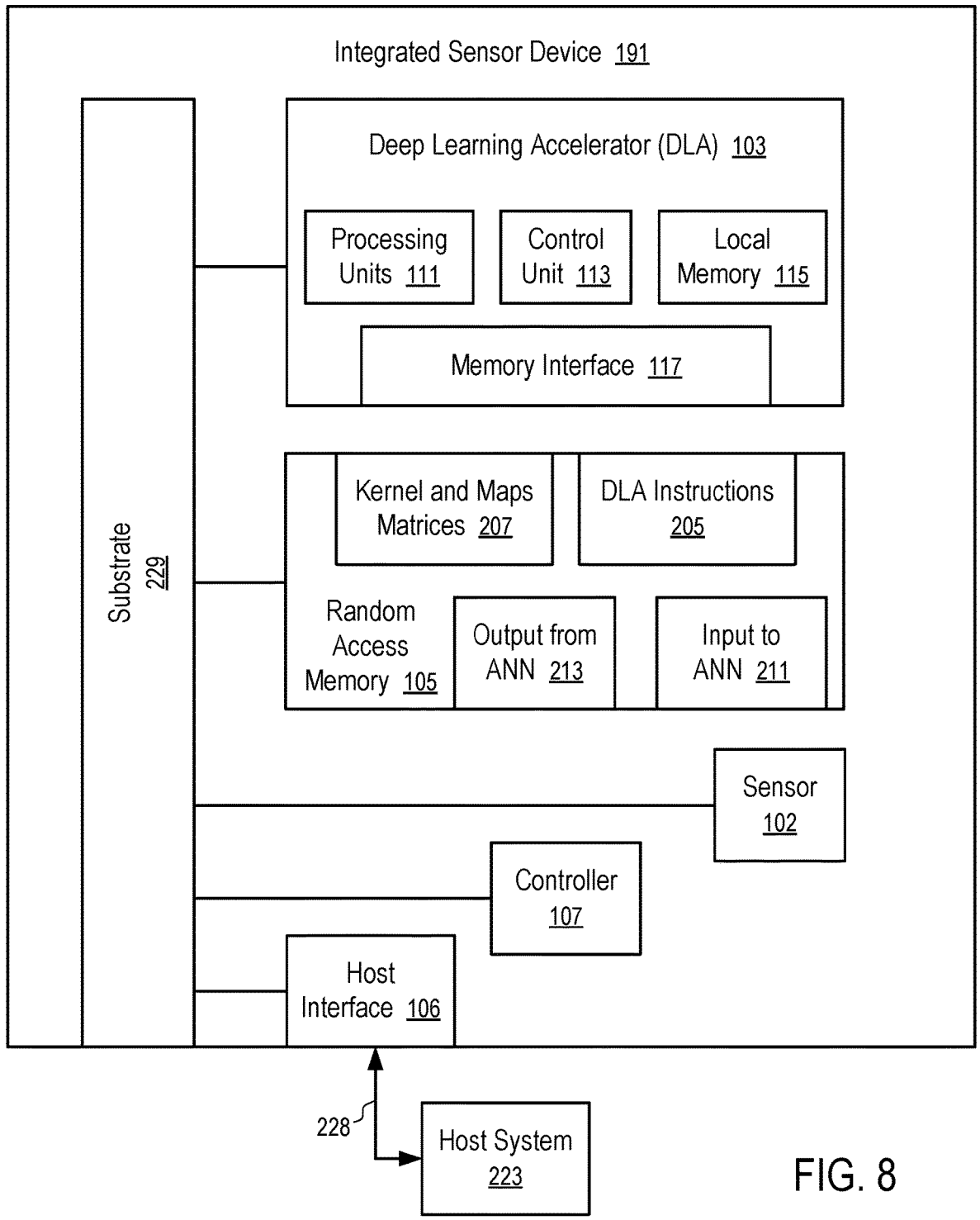
FIG. 8 shows an integrated sensor device having a Deep Learning Accelerator and random access memory configured according to one embodiment.

FIG. 8 shows an integrated sensor device (191) having a Deep Learning Accelerator (13) and random access memory (105) configured according to one embodiment.

The integrated sensor device (191) of FIG. 8 has a substrate (229) that provides connections among its components, such as a Deep Learning Accelerator (103), random access memory (105), a sensor (102), a controller (107) and a host interface (106).

In some implementations, the substrate (229) is an integrated circuit die having wires for connecting the components. Some of the components (e.g., the integrated circuit die(s) of the random access memory (105), the Deep Learning Accelerator (103), the controller (107) and/or the host interface (106)) can be connected to the integrated circuit die of the substrate (229) via Through Silicon Vias (TSVs). Other components can be connected to the substrate (229) via wire bonding, die attach, or another technique.

In some implementations, the substrate (229) is a printed circuit board having wires for connecting the components.

In some implementations, the logic circuit of the host interface (106) and/or the controller (107) are configured on the integrated circuit die of the Deep Learning Accelerator (103), or another integrated circuit die.

When the sensor (102) can receive stimuli through a housing, a packaging material, the integrated sensor device (191) can be sealed within the housing or the packaging material. Alternatively, an opening is provided in the housing or the packaging material to allow stimuli to reach the sensor (102). A set of connectors are provided to connect the host interface (106) to a host system (223) using a cable, a socket, a mother board, or another printed circuit board.

Figure 9:
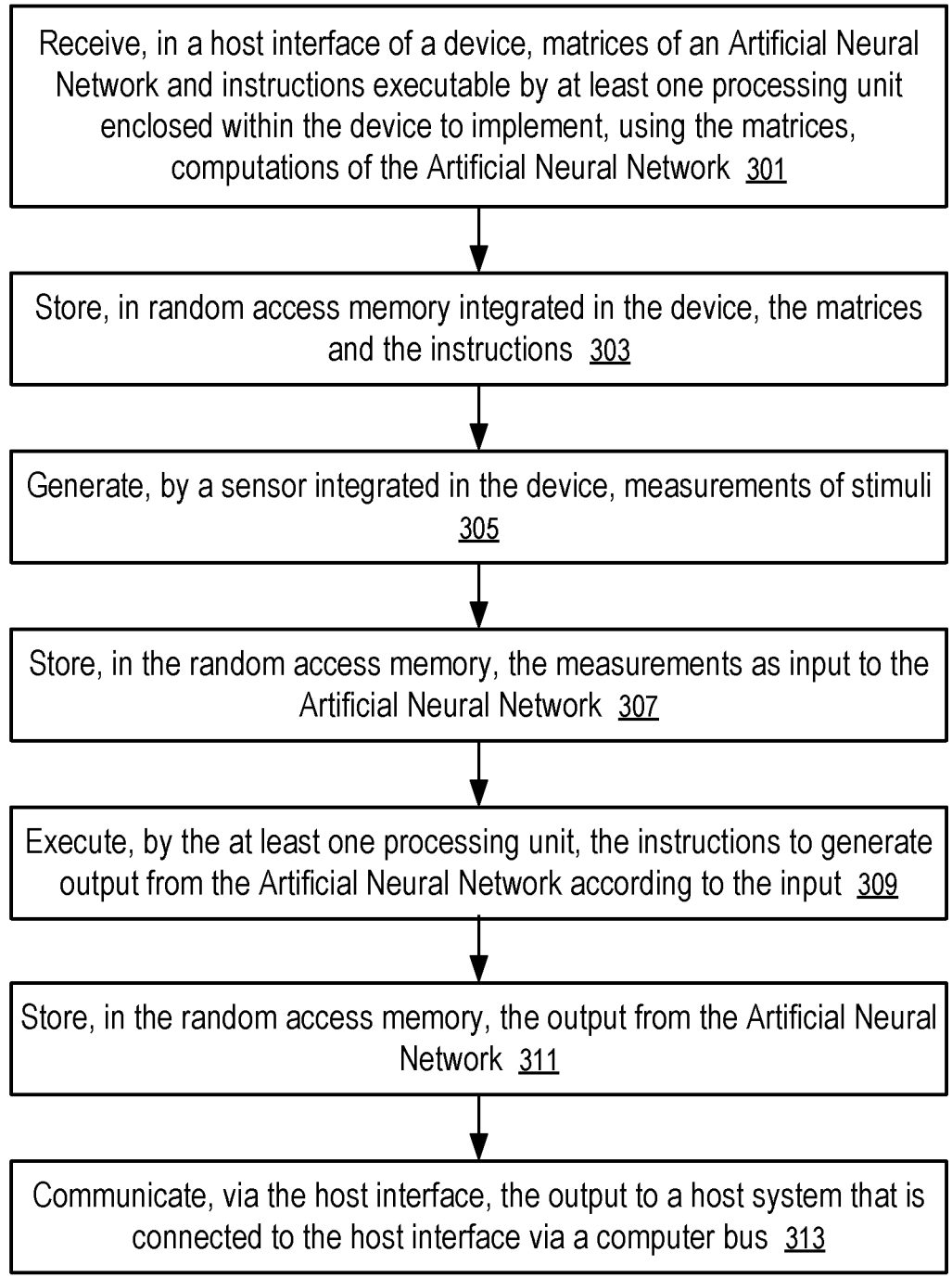
FIG. 9 shows a method implemented in an integrated sensor device according to one embodiment.

FIG. 9 shows a method implemented in an integrated sensor device according to one embodiment. For example, the method of FIG. 9 can be implemented in the integrated sensor device (191) of FIG. 8, or in the integrated circuit devices (101) of FIGS. 6 and 7.

At block 301, an integrated sensor device (e.g., 101 or 191) receives, in a host interface (106), matrices (207) of an Artificial Neural Network (201) and instructions (205) executable by at least one processing unit (111) enclosed within the device (e.g., 101 or 191) to implement, using the matrices (207), computations of the Artificial Neural Network (201).

For example, the at least one processing unit (111) can be formed on an integrated circuit die of a Field-Programmable Gate Array (FPGA) or Application Specific Integrated circuit (ASIC) implementing a Deep Learning Accelerator (103). The Deep Learning Accelerator (103) can include the at least one processing unit (111) for matrix instruction execution, local memory (115) to buffer matrix operands and results, a control unit (113) that can load the instructions (205) from random access memory (105) for execution, and a memory interface (117) to access the random access memory (105).

For example, the integrated sensor device (e.g., 101 or 191) can have a controller (107) to operate the host interface (106). The controller (107) can be separate from the control unit (113) or be integrated within the control unit of the Deep Learning Accelerator (103).

At block 303, the integrated sensor device (e.g., 101 or 191) stores the matrices (207) and the instructions (205) in random access memory (105) that is integrated in the device (e.g., 101 or 191).

At block 305, a sensor (102) integrated in the device (e.g., 101 or 191) generates measurements of stimuli, such as acceleration, rotation, vibration, pressure, touch, sound, light, infrared radiation, stress, strain, etc.

At block 307, the integrated sensor device (e.g., 101 or 191) stores, in the random access memory (105), the measurements as input to the Artificial Neural Network (201).

At block 309, the at least one processing unit (111) executes the instructions (205) to generate output (213) from the Artificial Neural Network (201) according to the input (211).

At block 311, the integrated sensor device (e.g., 101 or 191) stores, in the random access memory (105), the output (213) from the Artificial Neural Network (213).

At block 313, the integrated sensor device (e.g., 101 or 191) communicates, via the host interface (106), the output (213) to a host system (223) that is connected to the host interface (106) via a computer bus, such as a memory bus or a peripheral bus.

For example, the host interface (106) can include logic circuit to implement a serial communication protocol of the peripheral bus, such as a protocol of Serial Advanced Technology Attachment (SATA), Peripheral Component Interconnect Express (PCIe), Universal Serial Bus (USB), NVM (Non-Volatile Memory) Express (NVMe), etc.

For example, the logic circuit of the host interface (106) can be formed on a separate integrated circuit die or be integrated on to the integrated circuit die of the Field-Programmable Gate Array (FPGA) or Application Specific Integrated circuit (ASIC).

In some implementations, the integrated sensor device (e.g., 101 or 191) has an integrated circuit package that encloses the device; and a set of connectors (e.g., pins or contact balls) can provide a connection between the host interface (106) and an external circuit or connection, such as a printed circuit board, a cable, or a receptacle (e.g., a slot on a mother board).

In some instances, the integrated circuit package configured to substantially enclose the entire device (e.g., 101 or 191) except that an opening is provided for the stimuli being measured to reach the sensor.

The integrated sensor device (e.g., 101 or 191) can have a substrate (229) having wires configured to connect the controller (107) and/or the control unit (113) to the sensor (102), the host interface (106) and the random access memory (105). For example, the sensor (102) can be formed on the substrate (229) (e.g., as an electromechanical device or a semiconductor device).

For example, the substrate (229) can include a printed circuit board, or an integrated circuit die, or any combination thereof; and the substrate (229) can further include wires configured to connect the FPGA or ASIC of the Deep Learning Accelerator (103) to the random access memory (105).

Alternatively, the random access memory (105) and the Deep Learning Accelerator (103) can be formed on separate integrated circuit dies that are stacked and connected by Through-Silicon Vias (TSVs). Thus, the connection (117) between the memory interface (119) of the Deep Learning Accelerator (103) and the random access memory (105) does not go through the substrate (229).

In one implementation, the integrated sensor device (e.g., 101 or 191) has an integrated circuit package that encloses at least the FPGA or ASIC of the Deep Learning Accelerator (103) and the random access memory (105).

The present disclosure includes methods and apparatuses which perform the methods described above, including data processing systems which perform these methods, and computer readable media containing instructions which when executed on data processing systems cause the systems to perform these methods.

A typical data processing system may include an inter-connect (e.g., bus and system core logic), which interconnects a microprocessor(s) and memory. The microprocessor is typically coupled to cache memory.

The inter-connect interconnects the microprocessor(s) and the memory together and also interconnects them to input/output (I/O) device(s) via I/O controller(s). I/O devices may include a display device and/or peripheral devices, such as mice, keyboards, modems, network interfaces, printers, scanners, video cameras and other devices known in the art. In one embodiment, when the data processing system is a server system, some of the I/O devices, such as printers, scanners, mice, and/or keyboards, are optional.

The inter-connect can include one or more buses connected to one another through various bridges, controllers and/or adapters. In one embodiment the I/O controllers include a USB (Universal Serial Bus) adapter for controlling USB peripherals, and/or an IEEE-1394 bus adapter for controlling IEEE-1394 peripherals.

The memory may include one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In the present disclosure, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to non-transitory, recordable and non-recordable type media such as volatile and non-volatile memory devices, Read Only Memory (ROM), Random Access Memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A device, comprising:
a substrate;
random access memory configured to store first data representative of weights of an artificial neural network and store second data representative of instructions executable to implement matrix computations of the artificial neural network using the first data representative of the weights of the artificial neural network;
an integrated circuit die of a field-programmable gate array (FPGA) or application specific integrated circuit (ASIC) implementing a deep learning accelerator (DLA), the deep learning accelerator comprising:
at least one processing unit configured to execute the instructions having matrix operands; and
a control unit configured to load the instructions from the random access memory for execution;
wherein the random access memory and the deep learning accelerator are formed on separate integrated circuit dies and connected by through-silicon vias (TSVs) without going through the substrate;
an integrated circuit package configured to enclose at least the FPGA or ASIC and the random access memory;
a sensor configured to generate third data representative of measurements of one or more stimuli;
a host interface connectable to a host system; and
a controller coupled with the host interface, the sensor and the random access memory, wherein the controller is configured to write the third data representative of the measurements generated by the sensor into the random access memory as an input to the artificial neural network;
wherein the controller is configured to communicate, after the at least one processing unit generates in the random access memory an output of the artificial neural network by executing the instructions represented by the second data stored in the random access memory, the output to the host system via the host interface.

2. A method, comprising:
receiving, via a host interface of a device, first data representative of weights of an artificial neural network and second data representative of instructions executable by at least one processing unit of the device to implement, using the first data, matrix computations of the artificial neural network;
storing, in random access memory of the device, the first data representative of the weights and the second data representative of instructions;
generating, by a sensor integrated in the device, third data representative of measurements of one or more stimuli;
storing, in the random access memory, the third data representative of the measurements as an input to the artificial neural network;
executing, by the at least one processing unit, the instructions represented by the second data stored in the random access memory of the device to generate an output from the artificial neural network based at least in part on the first data and third data stored in the random access memory of the device;

storing, in the random access memory, the output from the artificial neural network;

transmitting, via the host interface, a message to a host system, the message indicative of availability of the output in the random access memory; and communicating, via the host interface, the output to the host system that is connected to the host interface, wherein the communicating of the output to the host system is responsive to a reply to the message.

3. An apparatus, comprising:

a substrate;

a sensor configured on the substrate to generate measurements of stimuli;

random access memory configured to store a model of an artificial neural network;

a field-programmable gate array (FPGA) or application specific integrated circuit (ASIC) implementing a deep learning accelerator (DLA), the deep learning accelerator having:
- a memory interface to access the random access memory;
- a control unit; and
- at least one processing unit configured to execute instructions having matrix operands to implement computations of the artificial neural network according to the model, wherein the random access memory and the deep learning accelerator are formed on separate integrated circuit dies and connected by through-silicon vias (TSVs) without going through the substrate;

an integrated circuit package configured to enclose at least the FPGA or ASIC and the random access memory; and a host interface connectable to a host system;

wherein the sensor stores the measurements into the random access memory as an input to the artificial neural network;

wherein the FPGA or ASIC performs the computations of the artificial neural network according to the model to convert the input to an output from the artificial neural network; and wherein the host interface communicates the output to the host system.

4. The device of claim 1, wherein the substrate has wires configured to connect the controller to the sensor, the host interface and the random access memory.

5. The device of claim 4, wherein the host interface is connectable to a memory bus.

6. The device of claim 4, wherein the host interface is connectable to a peripheral bus.

7. The device of claim 6, wherein the host interface implements a serial communication protocol of the peripheral bus.

8. The device of claim 4, wherein the control unit includes the controller.

9. The device of claim 8, wherein logic circuit of the host interface is configured on the integrated circuit die.

10. The device of claim 9, further comprising:
an integrated circuit package configured to enclose the device; and
a set of connectors connectable to a printed circuit board, a cable, or a receptacle.

11. The device of claim 9, further comprising:
an integrated circuit package configured to enclose the device with an opening for the sensor to receive the stimuli.

12. The device of claim 4, wherein the sensor is formed in or mounted on the substrate;
wherein the at least one processing unit includes a matrix-matrix unit configured to operate on two matrix operands of an instruction;
wherein the matrix-matrix unit includes a plurality of matrix-vector units configured to operate in parallel;
wherein each of the plurality of matrix-vector units includes a plurality of vector-vector units configured to operate in parallel; and
wherein each of the plurality of vector-vector units includes a plurality of multiply-accumulate units configured to operate in parallel.

13. The device of claim 4, wherein the substrate includes a printed circuit board, or an integrated circuit die, or any combination thereof; and the substrate further includes wires configured to connect the FPGA or ASIC to the random access memory.

14. The method of claim 2, further comprising:
receiving, via the host interface, a first command requesting a first memory configuration of the random access memory for storing data of a predetermined type; and
providing, via the host interface, a response to the first command, the response including the first memory configuration identifying a location and a size of a portion of the random access memory for storing the data of the predetermined type.

15. The method of claim 14, further comprising:
receiving, in the host interface, a second command identifying a second memory configuration of the random access memory for storing the data of the predetermined type; and
configuring the random access memory according to the second memory configuration to store the data of the predetermined type.

16. The method of claim 2, further comprising:
transmitting, via the host interface, a selected portion of the input in response to the reply identifying the portion.

17. The apparatus of claim 3, wherein the random access memory includes non-volatile memory configured to store the model of the artificial neural network; the model includes instructions executable by the FPGA or ASIC; and the at least one processing unit includes a matrix-matrix unit configured to operate on two matrix operands of an instruction.

* * * * *